US012368792B2

(12) United States Patent
Gao et al.

(10) Patent No.: US 12,368,792 B2
(45) Date of Patent: Jul. 22, 2025

(54) ROTATING SHAFT ASSEMBLY AND ELECTRONIC DEVICE

(71) Applicant: Honor Device Co., Ltd., Shenzhen (CN)

(72) Inventors: Mingqian Gao, Shenzhen (CN); Yaolei Zhang, Shenzhen (CN); Haifei Li, Shenzhen (CN); Dengpan Yu, Shenzhen (CN); Longlong Gong, Shenzhen (CN); Yameng Wei, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 0 days.

(21) Appl. No.: 18/252,044

(22) PCT Filed: Sep. 5, 2022

(86) PCT No.: PCT/CN2022/116957
§ 371 (c)(1),
(2) Date: Jun. 22, 2023

(87) PCT Pub. No.: WO2023/109198
PCT Pub. Date: Jun. 22, 2023

(65) Prior Publication Data
US 2024/0129390 A1 Apr. 18, 2024

(30) Foreign Application Priority Data

Dec. 13, 2021 (CN) .......................... 202111522722.X
Feb. 24, 2022 (CN) .......................... 202210172478.7

(51) Int. Cl.
*G06F 1/16* (2006.01)
*H04M 1/02* (2006.01)
*H05K 7/16* (2006.01)

(52) U.S. Cl.
CPC ......... *H04M 1/022* (2013.01); *H04M 1/0268* (2013.01); *H05K 7/16* (2013.01)

(58) Field of Classification Search
CPC ...... G06F 1/1681; G09F 9/301; H04M 1/022; H04M 1/0268
See application file for complete search history.

(56) References Cited

U.S. PATENT DOCUMENTS 12,032,416 B2 * 7/2024 Feng ..................... G06F 1/1652
2014/0252180 A1 9/2014 Mau et al.
(Continued)

FOREIGN PATENT DOCUMENTS

CN   208421695 U   1/2019
CN   111692196 A   9/2020
(Continued)

*Primary Examiner* — Anthony Q Edwards
(74) *Attorney, Agent, or Firm* — Conley Rose, P.C.

(57) ABSTRACT

A rotating shaft assembly and an electronic device, where the rotating shaft assembly includes a panel and a rotatable support mechanism. The rotatable support mechanism includes a swing arm, a fixed structure, a limit part, and a support structure. The support structure is provided with a mounting plane, and the panel is fastened to the mounting plane; a first limit portion is formed on the swing arm; and the limit part is connected to the support structure, and a second limit portion is formed on the limit part. When the screen is in a folded state, the limit part is separated from the swing arm. When the screen is in an unfolded state, the second limit portion of the limit part can abut against the first limit portion of the swing arm, thereby implementing mutual constraint between the swing arm and the support structure.

20 Claims, 14 Drawing Sheets

(56) References Cited

U.S. PATENT DOCUMENTS

| | | | |
|---|---|---|---|
| 2021/0165466 A1 | 6/2021 | Kang et al. | |
| 2021/0271294 A1* | 9/2021 | Liao | G06F 1/181 |
| 2024/0206093 A1* | 6/2024 | Liao | H05K 5/0226 |
| 2024/0357025 A1* | 10/2024 | Zhang | H04M 1/0268 |

FOREIGN PATENT DOCUMENTS

| | | |
|---|---|---|
| CN | 211423150 U | 9/2020 |
| CN | 112243053 A | 1/2021 |
| CN | 112449036 A | 3/2021 |
| CN | 113067926 A | 7/2021 |
| CN | 113194183 A | 7/2021 |
| CN | 113653727 A | 11/2021 |
| CN | 113669357 A | 11/2021 |
| WO | 2021025441 A1 | 2/2021 |

* cited by examiner

ROTATING SHAFT ASSEMBLY AND ELECTRONIC DEVICE

CROSS-REFERENCE TO RELATED APPLICATIONS

This is a U.S. National Stage of International Application No. PCT/CN2022/116857 filed on Sep. 5, 2022, which claims priority to Chinese Patent Application No. 202111522722.X, filed with the China National Intellectual Property Administration on Dec. 13, 2021, and Chinese Patent Application No. 202210172478.7, filed with the China National Intellectual Property Administration on Feb. 24, 2022, all of which are incorporated herein by reference in their entireties.

TECHNICAL FIELD

This application relates to the field of electronic terminal technologies, and in particular, to a rotating shaft assembly and an electronic device.

BACKGROUND

A foldable terminal generally includes two housings, and the two housings implement folding rotation by using a rotating shaft assembly. The rotating shaft assembly includes a panel which can support a flexible screen. However, the existing rotating shaft assemblies feature a complex structure and numerous parts, with a gap present between some movable parts. Such a gap may cause a panel to float up and down, which affects flatness of the panel, and further affects flatness of a flexible screen when a foldable terminal is in a fully unfolded state, resulting in poor light and shadow effect.

SUMMARY

This application is intended to provide a rotating shaft assembly and an electronic device, to resolve the prior-art problem that existence of a gap between parts of a rotating shaft assembly causes floating of a panel which in turn affects flatness of a flexible screen and light and shadow effect.

A first aspect of this application provides a rotating shaft assembly, including a panel and a rotatable support mechanism, where
  the rotatable support mechanism includes a swing arm, a fixed structure, a limit part, and a support structure;
  the support structure is provided with a mounting plane, and the panel is fastened on the mounting plane;
  two ends of the swing arm are rotatably connected to the fixed structure and the support structure respectively, and a first limit portion is formed on an end of the swing arm facing away from the panel; and
  the limit part is connected to the support structure, and a second limit portion is formed on an end of the limit part facing towards the panel; where
  when the rotatable support mechanism is in a fully unfolded state, the first limit portion abuts against the second limit portion.

While the support structure is rotating relative to the swing arm, the limit part that is connected to the support structure also moves relative to the swing arm. Specifically, when a screen is in an unfolded state, the second limit portion of the limit part is able to abut against the first limit portion of the swing arm, thereby implementing mutual constraint between the swing arm and the support structure. This effectively prevents the swing arm and the support structure from floating due to existence of the foregoing gap, and allows the support structure to stably support the panel, thereby ensuring flatness of the panel in the unfolded state and light and shadow effect of the screen.

In a possible implementation, the first limit portion is a surface of an end of the swing arm facing away from the panel. The swing arm abuts against the second limit portion of the limit part through a surface of a side of the swing arm, which can reduce space occupied between the swing arm and the limit part without adding additional parts. The surface of the swing arm can also provide a large contact area to ensure reliability of the swing arm abutting against the limit part. In a possible implementation, the second limit portion is a surface of an end of the limit part facing towards the panel. The limit part abuts against the first limit portion of the swing arm through a surface of a side of the limit part, which can reduce space occupied between the swing arm and the limit part without adding additional parts. The surface of the limit part can also provide a large contact area to ensure the reliability of the swing arm abutting against the limit part.

In a possible implementation, when the rotatable support mechanism is in a non-fully folded state, the first limit portion is separated from the second limit portion. When a folding mobile phone is in a non-fully folded state, the rotatable support mechanism is in the folded state, and in this case, the swing arm and the limit part are separated from each other, leaving the first limit portion and the second limit portion out of contact, thereby avoiding causing resistance to folding of the folding mobile phone.

In a possible implementation, an end of the support structure is provided with a limit structure, where when the rotatable support mechanism is in the fully folded state, the limit structure laps over an end of the fixed structure facing towards the panel; and when the rotatable support mechanism is in the non-fully folded state, the limit structure is separated from the fixed structure.

When the rotating shaft assembly is in the fully unfolded state, due to a factor of fit tolerance between parts of the rotating shaft assembly, a middle part of the panel is prone to collapse. To be specific, the panel is slightly bent in a direction facing away from the screen, which may also cause poor flatness of the screen and affect light and shadow effect. In view of this, in this application, when the rotating shaft assembly is in the fully unfolded state, the limit structure is in a lap fit with the fixed structure, so that the fixed structure can support the limit structure to prevent the support structure as a whole from sinking in a direction leaving the panel, thereby avoiding the problem of collapse of the panel.

In a possible implementation, the limit structure is a thin plate structure, a limit surface is formed on the end of the fixed structure facing towards the panel, and the limit structure abuts against the limit surface when the rotatable support mechanism is in the fully unfolded state. When the rotatable support mechanism is in the fully unfolded state, the limit surface can support the limit structure to prevent the support structure from sinking in a direction leaving the panel, thereby avoiding the problem of collapse of the panel. In a possible implementation, the support structure includes a mounting part and an adapter, where an end of the swing arm farther away from the fixed structure is rotatably connected to the adapter, and the mounting part is slidably connected to the adapter according to a preset track.

The adapter is fixedly connected to a first housing or a second housing of an electronic device, so that the adapter can drive the first housing or the second housing to move synchronously. When the swing arm rotates, the mounting part and the adapter also move relative to each other, so as to rotatably open or close the first housing and the second housing, preventing the first housing and the second housing from being interfered with or jammed by other surrounding components.

In a possible implementation, the limit part is provided with a positioning groove, the mounting part is provided with a positioning rod, and the positioning rod is fixedly mounted in the positioning groove.

The positioning rod of the mounting part protrudes from a side facing away from the panel. During mounting of the limit part, the positioning groove of the limit part may be fit onto a corresponding positioning rod to implement pre-positioning for mounting of the limit part, and then the limit part and the mounting part may be locked and fastened by using a screw. This not only facilitates operation but also ensures reliable connection between the limit part and the mounting part.

In a possible implementation, the positioning groove is provided with a mounting hole, the positioning rod is provided with a threaded hole, and the positioning rod is fixedly connected to the positioning groove through cooperation of the mounting hole, the threaded hole, and the screw.

After the positioning rod of the mounting part is inserted into the positioning groove of the limit part to complete pre-mounting, the screw may be tightened to the threaded hole of the positioning rod through the mounting hole of the positioning groove, allowing the limit part and the mounting part to be locked and fastened. This not only facilitates assembling of the limit part and the mounting part, but also ensures reliable connection and fastening of the limit part and the mounting part.

In a possible implementation, a mounting space is provided on a side of the mounting part facing away from the panel, and the mounting space is formed between the adapter, the mounting part, and the fixed structure. The limit part can be provided in the mounting space without occupying additional Z-directional space, thereby ensuring both the flatness of the panel and the thinness and lightness of the electronic device.

In a possible implementation, the mounting part is provided in a quantity of at least two, and the at least two mounting parts are respectively provided on two sides of the swing arm; the at least two mounting parts are all connected to the limit part, surfaces of the at least two mounting parts facing away from the limit part are formed as the mounting planes, and the mounting planes of the at least two mounting parts are all located on a same plane.

The at least two mounting parts together support the panel, which enhances reliability of supporting the panel. The mounting planes on each mounting part for supporting the panel are located on the same plane, so that the mounting planes of each mounting part have the same flatness, thereby ensuring the flatness of the panel and further ensuring good light and shadow effect of the screen.

In a possible implementation, the adapter is provided with an arc-shaped track groove, the mounting part is provided with an arc-shaped guide flange, and the guide flange is in a sliding fit with the track groove.

The track groove is provided on each of two sides of the adapter that are perpendicular to a rotation direction of the track groove, and both the track groove and the guide flange are arc-shaped. And the guide flange may slide in the track groove relative to the track groove. Cooperation of the guide flange and the track groove can ensure that the adapter rotates stably relative to the swing arm.

In a possible implementation, the track groove is provided on each of two sides of the adapter that are perpendicular to a rotation direction of the track groove, and both the track groove and the guide flange are arc-shaped. The guide flange may slide in the track groove relative to the track groove. Cooperation of the guide flange and the track groove can ensure that the adapter rotates stably relative to the swing arm.

In a possible implementation, the rotatable support mechanism further includes a hinge pin, the swing arm is provided with a first rotation hole, the adapter is provided with a second rotation hole that is coaxially disposed with the first rotation hole, and the swing arm is rotatably connected to the adapter through cooperation of the first rotation hole, the second rotation hole, and the hinge pin.

Such hinge pin can ensure that the first rotation hole and the second rotation hole coaxially rotate, avoiding a wobble between the swing arm and the adapter. In addition, connection using a hinge pin also facilitates assembly.

In a possible implementation, an end of the swing arm is provided with an arc-shaped rotating portion, an arc-shaped rotation space is formed on the fixed structure, and the rotating portion is rotatably disposed in the rotation space.

The arc-shaped rotating portion is formed as a structure with a side facing towards the panel being recessed and a side facing away from the panel being arched. The rotation space matches the rotating portion in shape, and an inner wall of the rotation space can provide movement guidance for the rotating portion to implement rotation of the rotating portion.

In a possible implementation, the fixed structure includes a first supporting part and a second supporting part, the first supporting part is fixedly connected to the second supporting part, and the rotation space is formed between the first supporting part and the second supporting part.

In a possible implementation, the first supporting part and the second supporting part are respectively located on two sides of the rotating portion, a side surface of the first supporting part facing towards the rotating portion is a first arc-shaped face, a side surface of the second supporting part facing towards the rotating portion is a second arc-shaped face, and the rotation space is formed between the first arc-shaped face and the second arc-shaped face. The first arc-shaped face and the second arc-shaped face can provide rotation guidance for the rotating portion.

In a possible implementation, a rotating shaft housing is further included, and the fixed structure is fixedly mounted to the rotating shaft housing. The rotating shaft housing can cover the fixed structure therein, to prevent parts such as the fixed structure and the swing arm from being damaged or contaminated by external environment.

In a possible implementation, the panel is made of a carbon fiber material. The panel that is made of the carbon fiber material is light in weight, allowing the electronic device to be light.

In a possible implementation, the panel is riveted to the mounting part. This can ensure stable connection between the panel and the mounting part.

A second aspect of this application further provides an electronic device, including a first housing, a second housing, and a screen, where the screen covers the first housing and the second housing; and the electronic device further includes the rotating shaft assembly according to the first aspect of this application, where the screen is fixedly supported by the panel, and the first housing and the second housing are opened or closed through the rotating shaft assembly.

It should be understood that the foregoing general description and the following detailed description are only examples and are not intended to limit this application.

REFERENCE SIGNS

Figure 1:
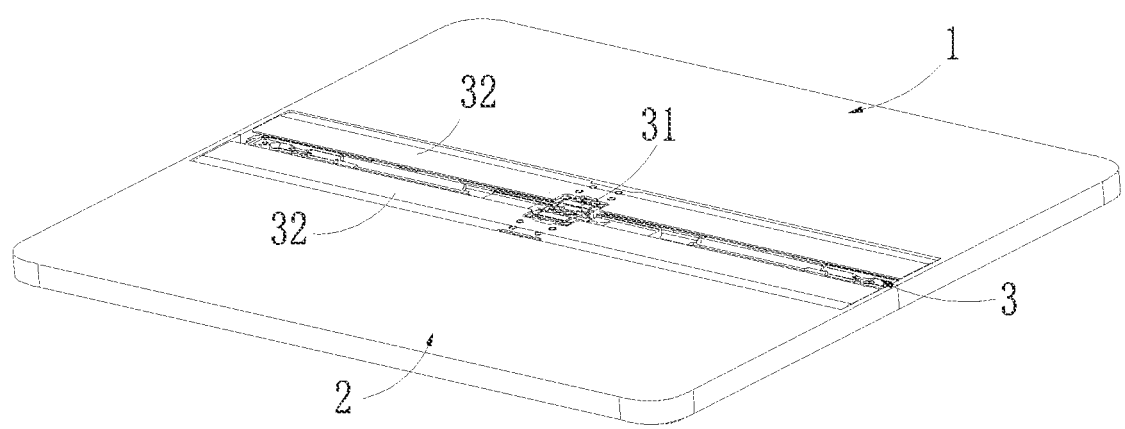
FIG. 1 is a schematic diagram of an electronic device in a fully unfolded state according to an embodiment of this application.

1: first housing;
2: second housing;
3: rotating shaft assembly:
   31: rotatable support mechanism;
      311: swing arm;
         3111: first rotation hole;
         3112: first limit portion;
         3113: rotating portion;
      312: fixed structure:
         3121: first supporting part:
            3121a: first arc-shaped face;
         3122: second supporting part;
            3122a: second arc-shaped face;
         3123: rotation space:
         3124: limit surface;
      313: limit part;
         3131: positioning groove;
            3131a: mounting hole:
         3132: second limit portion:
      314: support structure;
         3141: mounting part:
            3141a: mounting plane:
            3141b: flange:
            3141c: positioning rod;
            3141d: threaded hole:
            3141e: limit structure;
         3142: adapter:
            3142a: track groove;
            3142b: second rotation hole;
      315: hinge pin;
      316: screw:
      317: mounting space;
   32: panel:
   33: rotating shaft housing:
4: flexible printed circuit board: and
   41: wrinkle.

The accompanying drawings herein are incorporated into this specification and form a part of this specification, illustrate the embodiments conforming to this application, and are intended to explain the principles of this application together with this specification.

DESCRIPTION OF EMBODIMENTS

To make the objectives, technical solutions, and advantages of this application clearer, the following further describes this application in detail with reference to the accompanying drawings and embodiments. It should be understood that the specific embodiments described herein are merely used to explain this application, and are not intended to limit this application.

In the description of this application, unless otherwise specified and defined explicitly, the terms "first" and "second" are used for descriptive purposes only and cannot be understood as indicating or implying relative importance: unless otherwise specified or stated, the term "a plurality of" means two or more than two. The terms "connected", "fastened", and the like should be understood in a broad sense. For example, "connected" may be a fixed connection, and alternatively a detachable connection, or an integral connection, or an electrical connection: or may be a direct connection, and alternatively an indirect connection through an intermediate medium. A person of ordinary skills in the art can understand specific meanings of these terms in this application as appropriate to specific situations.

In the description of this specification, it should be understood that the terms such as "upper" and "lower" described in the embodiments of this application are described in the perspective shown in the accompanying drawings, which should not be understood as limitation on embodiments of this application. In addition, in the context, it should also be understood that w % ben an element is connected "on" or "under" another element, it can not only be directly connected "on" or "under" another element, but also be indirectly connected "on" or "under" another element through an intermediate element.

A folding mobile phone (Folding mobile phone) typically includes two movable housings, and the two housings can be folded or unfolded through a rotating shaft structure. The rotating shaft structure is generally assembled from numerous parts and features a complex structure. In the rotating shaft structure, a panel is a key component used to support a flexible screen. Flatness of the panel is one of important factors for determining whether the flexible screen is flat in an unfolded state. For the existing rotating shaft assembly, due to the numerous parts, an accumulated tolerance of all parts may affect the flatness of the panel. In addition, a tiny gap is left between parts that move relative to each other, so as to ensure normal action, but such gap also causes the panel to float, resulting in poor flatness of the panel, which in turn leads to unevenness of the flexible screen and poor light and shadow effect.

Figure 2:
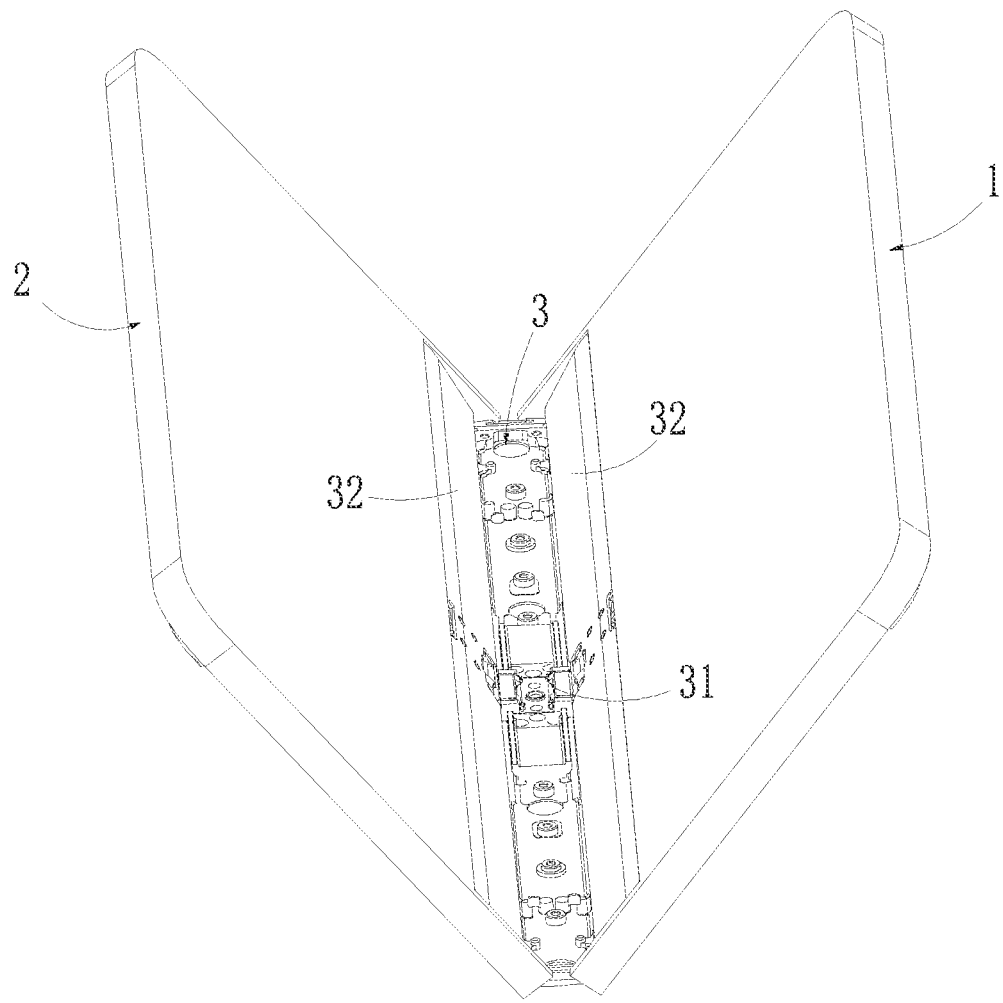
FIG. 2 is a schematic diagram of an electronic device when being folded according to an embodiment of this application.
Figure 3:
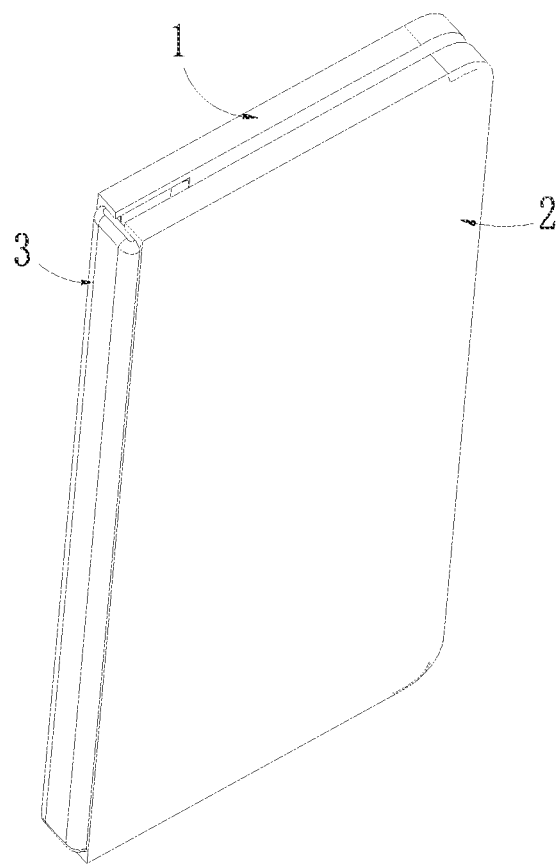
FIG. 3 is a schematic diagram of a folded electronic device according to an embodiment of this application.

In view of this, as shown in FIG. 1 to FIG. 3, an embodiment of this application provides an electronic device including a first housing 1, a second housing 2, and a screen (not shown in the figure), the screen covering the first housing 1 and the second housing 2, where the electronic device further includes a rotating shaft assembly 3 according to the embodiment of this application, the screen is fixedly supported by a panel 32 of the rotating shaft assembly 3, and the first housing 1 and the second housing 2 are opened or closed through the rotating shaft assembly 3. The screen may be a flexible screen. When the first housing 1 and the second housing 2 rotate, the flexible screen can be folded or fully unfolded. In the folded state, the electronic device can be closed. In the fully unfolded state, the electronic device can be opened to present images through the screen. The panel 32 of the rotating shaft assembly 3 may be fixedly connected to the screen, the panel 32 may push the screen to be folded or fully unfolded, and the screen in the fully unfolded state may be stably supported by the panel 32 to ensure the flatness of the screen.

It may be understood that the electronic device provided in the embodiment of this application may be a folding mobile phone, or other electronic devices having a folding function and a flatness requirement.

Figure 4:
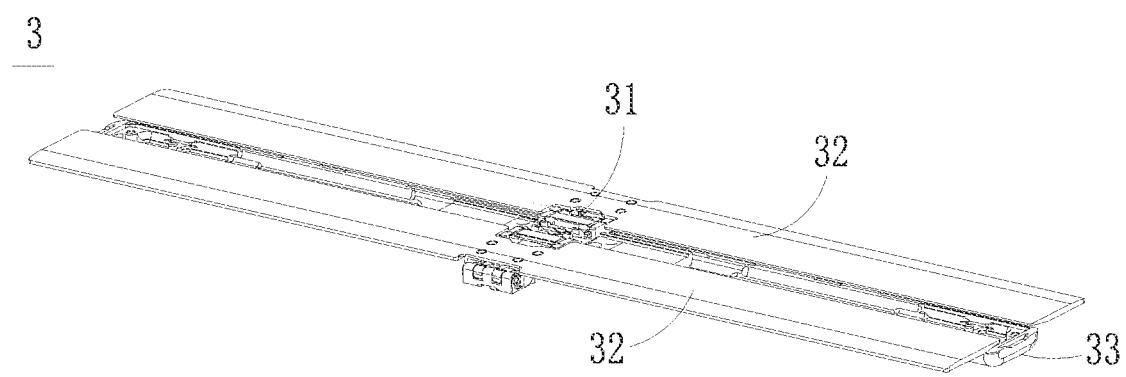
FIG. 4 is a first schematic structural diagram of a rotating shaft assembly.
Figure 5:
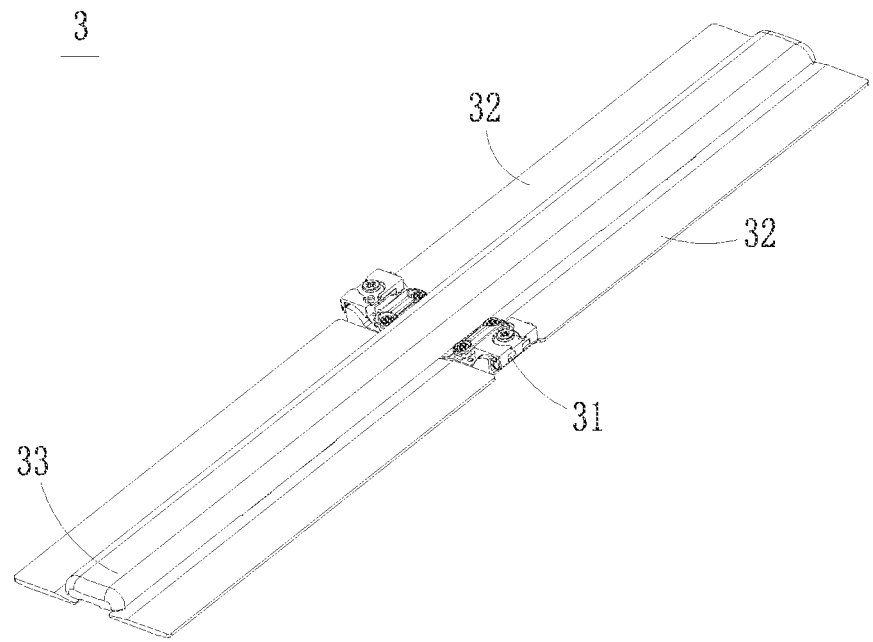
FIG. 5 is a second schematic structural diagram of a rotating shaft assembly.

Specifically, as shown in FIG. 4 and FIG. 5, the rotating shaft assembly 3 according to the embodiment of this application includes a panel 32 and a rotatable support mechanism 31. The rotatable support mechanism 31 may connect the panel 32 and the first housing 1 and the second housing 2 of the electronic device, rotation of the rotatable support mechanism 31 may drive the first housing 1 and the second housing 2 to rotate, and the screen may be folded or unfolded through the panel 32.

Figure 6:
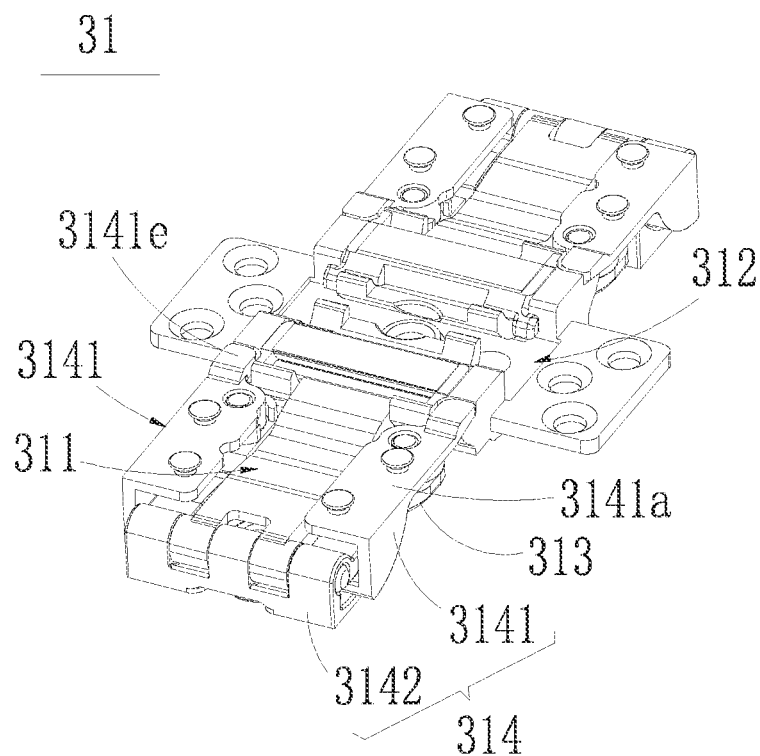
FIG. 6 is a schematic structural diagram of a rotatable support mechanism.
Figure 9:
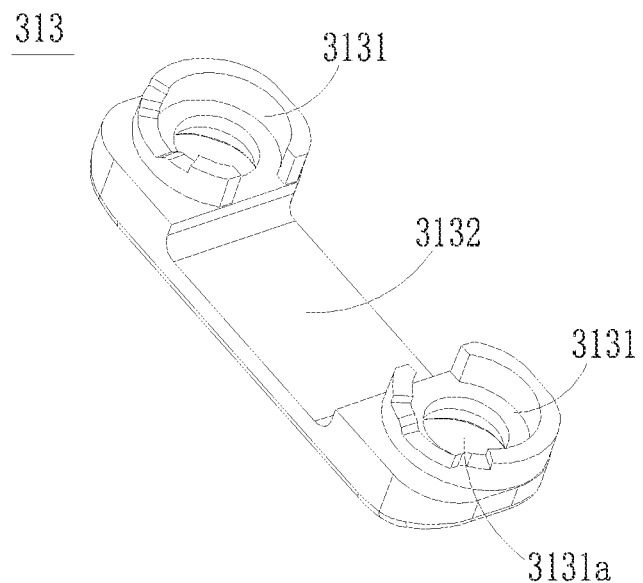
FIG. 9 is a schematic structural diagram of a limit part.
Figure 11:
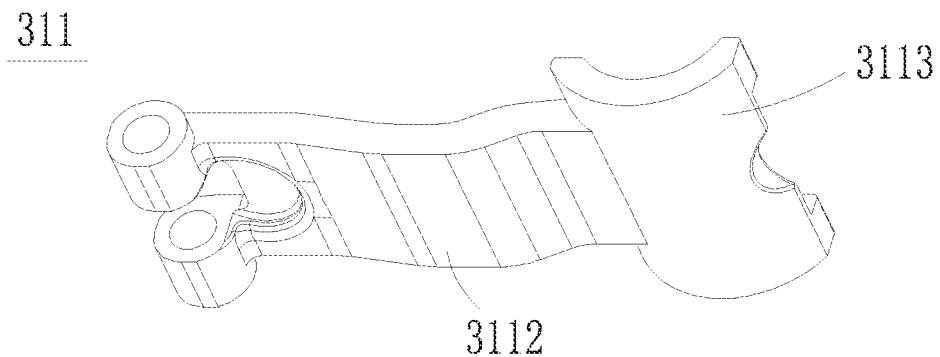
FIG. 11 is a second schematic structural diagram of a swing arm.

As shown in FIG. 6, the rotatable support mechanism 31 includes a swing arm 311, a fixed structure 312, a limit part 313, and a support structure 314. The support structure 314 is provided with a mounting plane 3141a, and the panel 32 is fastened on the mounting plane 3141a. Two ends of the swing arm 311 are rotatably connected to the fixed structure 312 and the support structure 314 respectively, the fixed structure 312 may be fastened between the first housing 1 and the second housing 2, and a first limit portion 3112 is formed on an end of the swing arm 311 facing away from the panel 32, as shown in FIG. 11. The limit part 313 is connected to the support structure 314, and a second limit portion 3132 is formed on an end of the limit part 313 facing towards the panel 32, as shown in FIG. 9. The second limit portion 3132 is located opposite the first limit portion 3112.

Figure 12:
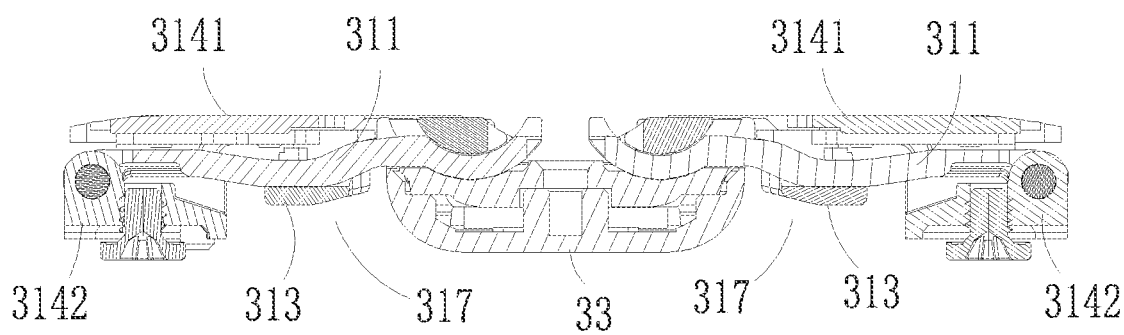
FIG. 12 is a cross-sectional view of a rotatable support mechanism in a fully unfolded state.
Figure 13:
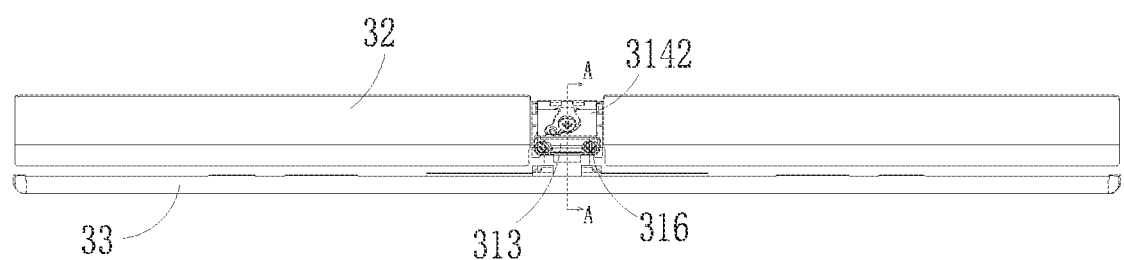
FIG. 13 is a schematic diagram of a rotating shaft assembly when being folded.
Figure 14:
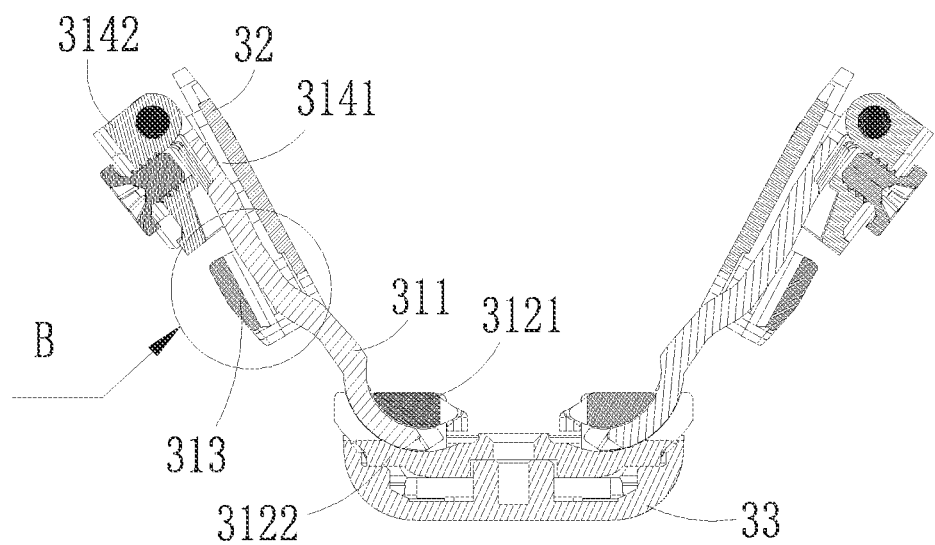
FIG. 14 is a cross-sectional view of FIG. 13 along A-A.
Figure 15:
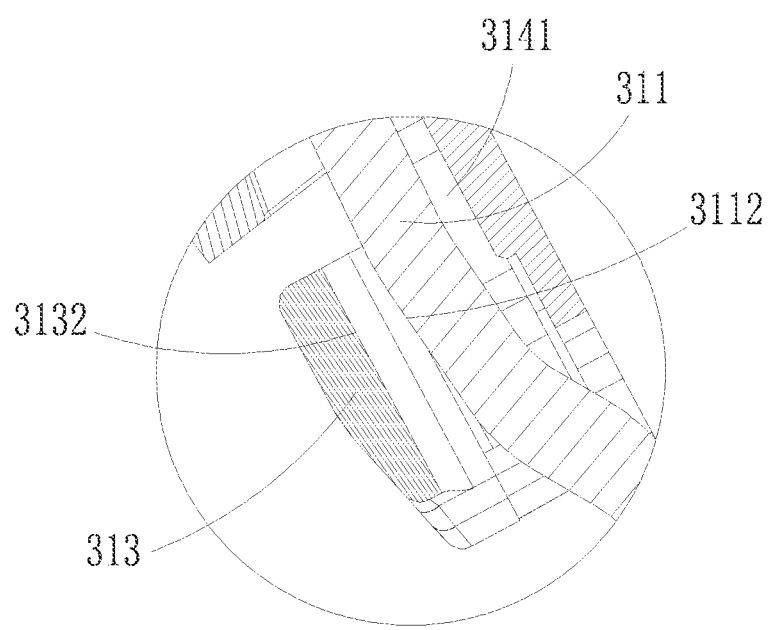
FIG. 15 is an enlarged view of position B in FIG. 14.
Figure 16:
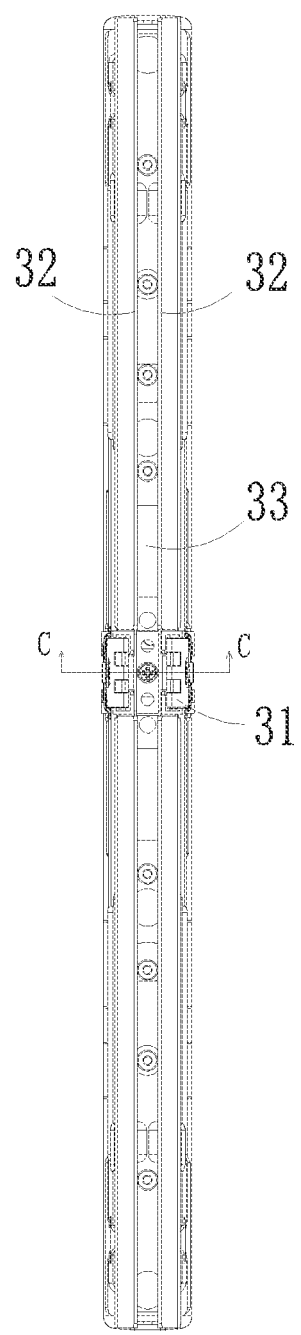
FIG. 16 is a schematic diagram of a folded rotating shaft assembly.
Figure 17:
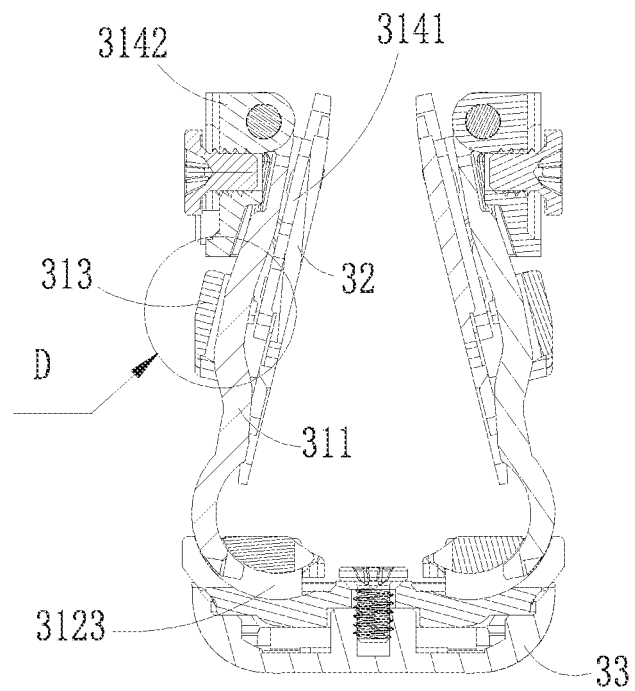
FIG. 17 is a cross-sectional view of FIG. 16 along C-C.
Figure 18:
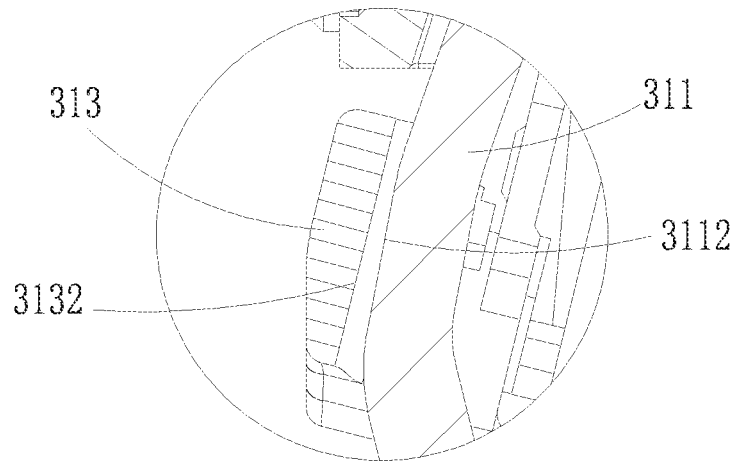
FIG. 18 is an enlarged view of position D in FIG. 17.

As shown in FIG. 12, when the rotatable support mechanism 31 is in the fully unfolded state, the first limit portion 3112 abuts against the second limit portion 3132. As shown in FIG. 13 to FIG. 18, when the rotatable support mechanism 31 is in the non-fully folded state, the first limit portion 3112 is separated from the second limit portion 3132. FIG. 13 is a schematic diagram of a rotating shaft assembly when being folded, FIG. 14 is a cross-sectional view of FIG. 13 along A-A, and FIG. 15 is an enlarged view of position B in FIG. 14. As shown in FIG. 13 to FIG. 15, a user typically does not have a requirement on screen flatness when the rotating shaft assembly is rotating, and has a requirement on the screen flatness only when the screen is entirely in a fully unfolded state, in order to obtain better light and shadow effect during use. Therefore, in a rotating process of the rotating shaft assembly, the first limit portion 3112 and the second limit portion 3132 can remain separated from each other. FIG. 16 is a schematic diagram of a folded rotating shaft assembly, FIG. 17 is a cross-sectional view of FIG. 16 along C-C, and FIG. 18 is an enlarged view of position D in FIG. 17. As shown in FIG. 16 to FIG. 18, after the rotating shaft assembly finishes folding, the first housing and the second housing of the electronic device are docked together, and in this state, the user has no need to use the electronic device. Therefore, in this state, the first limit portion 3112 and the second limit portion 3132 can also remain separated from each other.

It should be noted that the swing arm 311 needs to rotate relative to the fixed structure 312 so as to unfold or fold the screen. A tiny gap is left between the swing arm 311 and the fixed structure 312 to ensure normal rotation of the swing arm 311. Such a gap may lead to a slight amount of wobble of the swing arm 311, which in turn causes the panel 32 to float, making the panel 32 arched or collapsed at a joint position of the panel 32 and the support structure 314, leading to poor flatness of the panel 32, and affecting light and shadow effect.

In view of this, in this embodiment, a limit part 313 is used to be connected to the support structure 314. The limit part 313 may move synchronously with the support structure 314, and the support structure 314 may be connected to the first housing 1 or the second housing 2 of the electronic device. When an end of the swing arm 311 rotates relative to the fixed structure 312, the swing arm 311 may drive the support structure 314 to rotate, the other end of the swing arm 311 is rotatably connected to the support structure 314. The support structure 314 also rotates slightly relative to the swing arm 311 while the support structure 314, driven by the swing arm 311, rotates with the swing arm 311, so as to ensure that the first housing 1 or the second housing 2 connected to the support structure 314 can be opened or fully unfolded without jamming.

Because the limit part 313 is fastened on the support structure 314, while the support structure 314 is rotating relative to the swing arm 311, the limit part 313 that is connected to the support structure 314 also moves relative to the swing arm 311. Specifically, as shown in FIG. 14 and FIG. 15, when the screen is in the folded state, the limit part 313 is separated from the swing arm 311. As shown in FIG. 12, when the screen is in the unfolded state, the second limit portion 3132 of the limit part 313 is able to abut against the first limit portion 3112 of the swing arm 311, thereby implementing mutual constraint between the swing arm 311, the support structure 314, and the limit part 313 in a direction perpendicular to a surface of the panel 32. This effectively prevents the swing arm 311 and the support structure 314 from floating due to existence of the foregoing gap, and allows the support structure 314 to stably support the panel 32, thereby ensuring flatness of the panel 32 in the unfolded state and light and shadow effect of the screen.

When the folding mobile phone is in the non-fully folded state, the rotatable support mechanism is in the folded state, and in this case, the swing arm 311 and the limit part 313 are separated from each other, leaving the first limit portion 3112 and the second limit portion 3132 out of contact, thereby avoiding causing resistance to folding of the folding mobile phone.

In addition, it should be noted that if the electronic device is a folding mobile phone, a flexible printed circuit board 4 (Flexible Printed Circuit, FPC for short) that is connected to the mainboard is typically disposed between the panel 32 and a housing of the folding mobile phone. The flexible printed circuit board 4 has excellent characteristics such as light mass, small thickness, and easy bending and folding. The flexible printed circuit board 4 is specifically disposed on at least one side of the rotatable support mechanism 31 in a length direction of the panel 32. Because a space is present between the panel 32 and the housing of the folding mobile phone, the flexible printed circuit board 4 can be flexibly deformed in the space in the folding or unfolding process of the folding mobile phone.

Figure 19:
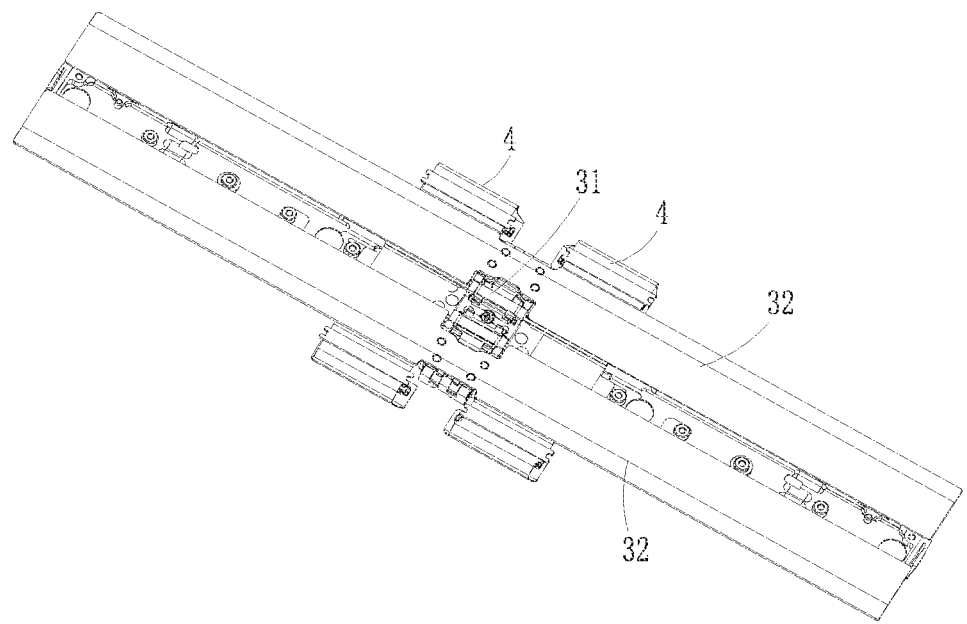
FIG. 19 is a first schematic structural diagram of cooperation of a rotating shaft assembly and a flexible printed circuit board.
Figure 20:
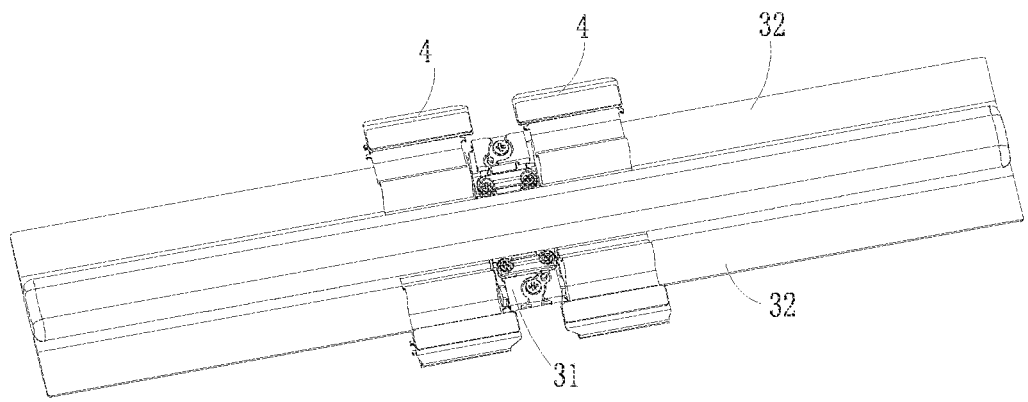
FIG. 20 is a second schematic structural diagram of cooperation of a rotating shaft assembly and a flexible printed circuit board.
Figure 21:
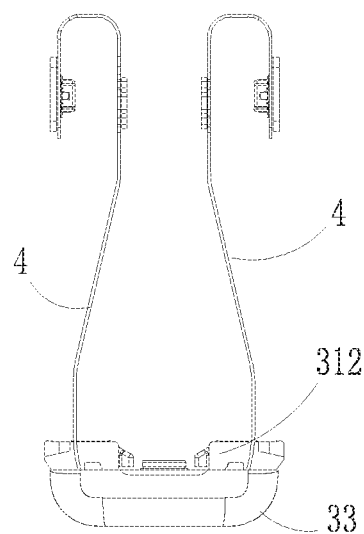
FIG. 21 is a state diagram of a flexible printed circuit board when a rotating shaft assembly is in a folded state.
Figure 22:
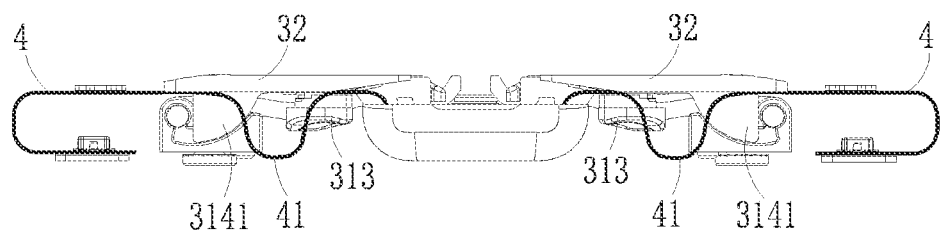
FIG. 22 is a state diagram of a flexible printed circuit board when a rotating shaft assembly is in a fully unfolded state.

Specifically, FIG. 19 is a first schematic structural diagram of cooperation of a rotating shaft assembly 3 and a flexible printed circuit board 4, FIG. 20 is a second schematic structural diagram of cooperation of a rotating shaft assembly 3 and a flexible printed circuit board 4. FIG. 21 is a state diagram of a flexible printed circuit board 4 when a rotating shaft assembly 3 is in a folded state, and FIG. 22 is a state diagram of a flexible printed circuit board 4 when a rotating shaft assembly 3 is in a fully unfolded state. As shown in FIG. 21, the flexible printed circuit board 4 is in a stretchy state when the rotating shaft assembly 3 is in a non-fully folded state. As shown in FIG. 22, due to relative movement between the support structure 314 and the swing arm, when the rotating shaft assembly 3 switches from a folded state to a fully unfolded state, the space between the panel 32 and the folding mobile phone housing is compressed to some degree, such that the flexible printed circuit board 4 is flexibly deformed to some degree. By utilizing the characteristics of being flexible and easily bendable and foldable, the flexible printed circuit board 4 can generate wrinkles locally to reduce its volume, ensuring free switching between the folded state and the fully unfolded state.

However, as shown in FIG. 22, when the rotating shaft assembly 3 is in the fully unfolded state, wrinkles generated by deformation of the flexible printed circuit board 4 itself may cause the flexible printed circuit board 4 to become larger in a direction perpendicular to a surface of the panel 32, such that the flexible printed circuit board 4 generates an extrusion force on the panel 32. The panel 32 is partially arched due to the extrusion force, causing the screen to be uneven and have folds and affecting light and shadow effect.

In view of this, in this embodiment, the limit part 313 is provided, and when the rotating shaft assembly 3 is in the fully unfolded state, the second limit portion 3132 of the limit part 313 abuts against the first limit portion 3112 of the swing arm 311. When the flexible printed circuit board 4 generates an extrusion force on the panel 32, constraint between the limit part 313 and the swing arm 311 can prevent the panel 32 from being arched by the flexible printed circuit board 4, so that the panel 32 still has a good flatness while being extruded by the flexible printed circuit board 4, thereby ensuring good light and shadow effect of the screen.

As shown in FIG. 11, the first limit portion 3112 is a surface of an end of the swing arm 311 facing away from the panel 32. The swing arm 311 abuts against the second limit portion 3132 of the limit part 313 through a surface of a side of the swing arm 311, which can reduce space occupied between the swing arm 311 and the limit part 313 without adding additional parts. The surface of the swing arm 311 can also provide a large contact area to ensure the reliability of the swing arm 311 abutting against the limit part 313.

Likewise, as shown in FIG. 9, the second limit portion 3132 is a surface of an end of the limit part 313 facing towards the panel 32. The limit part 313 abuts against the first limit portion 3112 of the swing arm 311 through a surface of a side of the limit part 313, which can reduce space occupied between the swing arm 311 and the limit part 313 without adding additional parts. The surface of the limit part 313 can also provide a large contact area to ensure the reliability of the swing arm 311 abutting against the limit part 313.

In addition, as shown in FIG. 19 and FIG. 20, the panel 32 is generally an elongated thin plate structure. When the rotating shaft assembly 3 is in a fully unfolded state, due to a factor of fit tolerance between parts of the rotating shaft assembly 3, the middle part of the panel 32 is prone to collapse, to be specific, the panel 32 is slightly bent in a direction facing away from the screen, which may also cause poor flatness of the screen and affect light and shadow effect.

In view of this, in this embodiment, as shown in FIG. 6 to FIG. 8 and FIG. 23, an end of the support structure 314 is provided with a limit structure 3141e. When the rotatable support mechanism 31 is in the fully unfolded state, the limit structure 3141e laps over an end of the fixed structure 312 facing towards the panel 32. When the rotatable support mechanism 31 is in the non-fully folded state, the limit structure 3141e is separated from the fixed structure 312.

Figure 7:
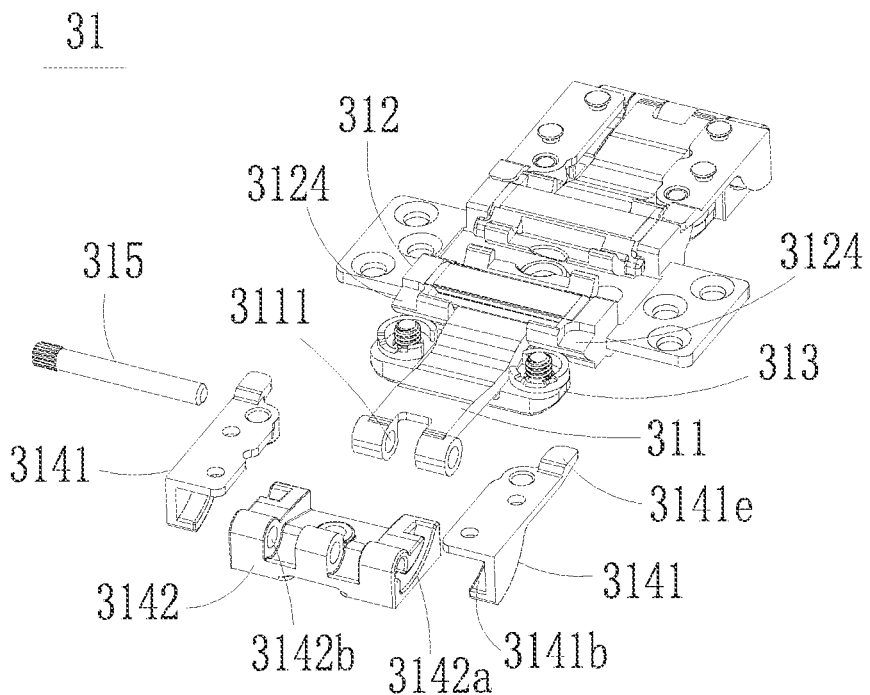
FIG. 7 is a first partial exploded view of a rotatable support mechanism.
Figure 8:
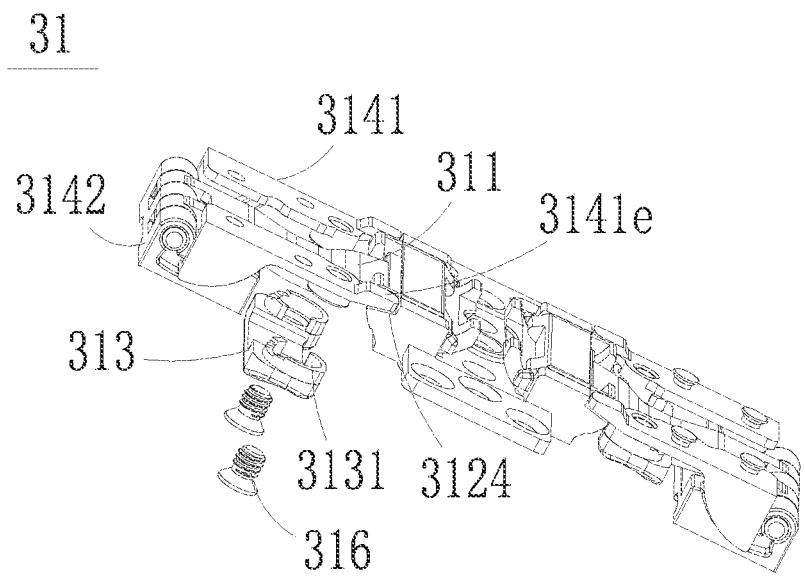
FIG. 8 is a second partial exploded view of a rotatable support mechanism.

Specifically, as shown in FIG. 6 to FIG. 8, the limit structure 3141e is of a thin plate structure, and a limit surface 3124 is formed on the end of the fixed structure 312 facing towards the panel 32. In the fully unfolded state, the limit structure 3141e laps over the limit surface 3124 of the fixed structure 312. The limit surface 3124 can support the limit structure 3141e to prevent the support structure 314 from sinking in a direction leaving the panel 32, thereby avoiding the problem of collapse of the panel 32. Therefore, in this embodiment, the cooperation of the limit structure 3141e and the fixed structure 312 can prevent the support structure 314 and the panel 32 from sinking, and the cooperation of the limit part 313 and the swing arm 311 can prevent the panel from being arched by the flexible printed circuit board 4. Therefore, the rotating shaft assembly provided in this embodiment can effectively avoid floating or sinking of the panel, which ensures that the panel has a good flatness in the fully unfolded state, further ensuring good light and shadow effect of the screen and improving user experience.

Figure 23:
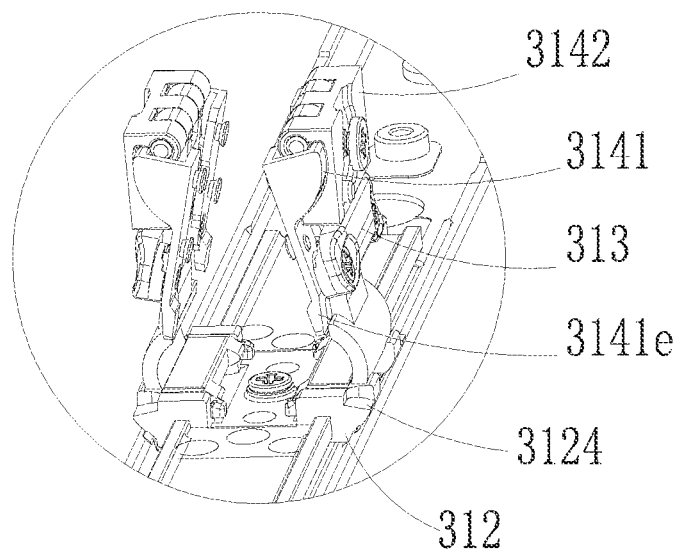
FIG. 23 is a partial view of a rotating shaft assembly in a folded state.

In addition, as shown in FIG. 23, in a non-fully folded state, the electronic device is typically in a non-use state. In this state, the user has no requirement on screen flatness, and the limit structure 3141e is separated from the limit surface 3124 of the fixed structure 312 without any constraint between them, thereby ensuring a normal folding action of the rotating shaft assembly 3.

It may be understood that, as shown in FIG. 4 and FIG. 5, the panel 32 is generally an elongated thin plate structure. To support the panel 32 more stably, the rotatable support mechanism 31 may be provided in a quantity of at least two in an extension direction of the panel 32. Certainly; in this application, with only one rotatable support mechanism 31 provided in the middle area of the panel 32, the panel 32 can be reliably supported, ensuring the flatness of the panel 32.

In this embodiment, the panel 32 may be made of a carbon fiber material. Compared with the panel 32 made of a metal material in the prior art, the panel 32 made of the carbon fiber material is light in mass, helping achieve a light weight of the electronic device.

As shown in FIG. 3 and FIG. 5, the rotating shaft assembly 3 further includes a rotating shaft housing 33. The fixed structure 312 is fixedly mounted to the rotating shaft housing 33. The rotating shaft housing 33 can cover the fixed structure 312 therein, to prevent parts such as the fixed structure 312 and the swing arm 311 from being damaged or contaminated by external environment. In addition, the first housing 1 and the second housing 2 are symmetrically distributed on two sides of the rotating shaft housing 33. The panel 32 may also be provided in a quantity of two, and the two panels 32 are symmetrically distributed on two sides of the rotating shaft housing 33. Each panel 32 is rotatably supported by at least one rotatable support mechanism 31 in a length direction of the panel 32. The rotatable support mechanisms 31 for supporting the two panels 32 are also symmetrically distributed on two sides of the rotating shaft housing 33, thereby ensuring consistent support effect on the two panels 32. The two symmetrically-distributed rotatable support mechanisms 31 may be jointly connected to one fixed structure 312.

Figure 24:
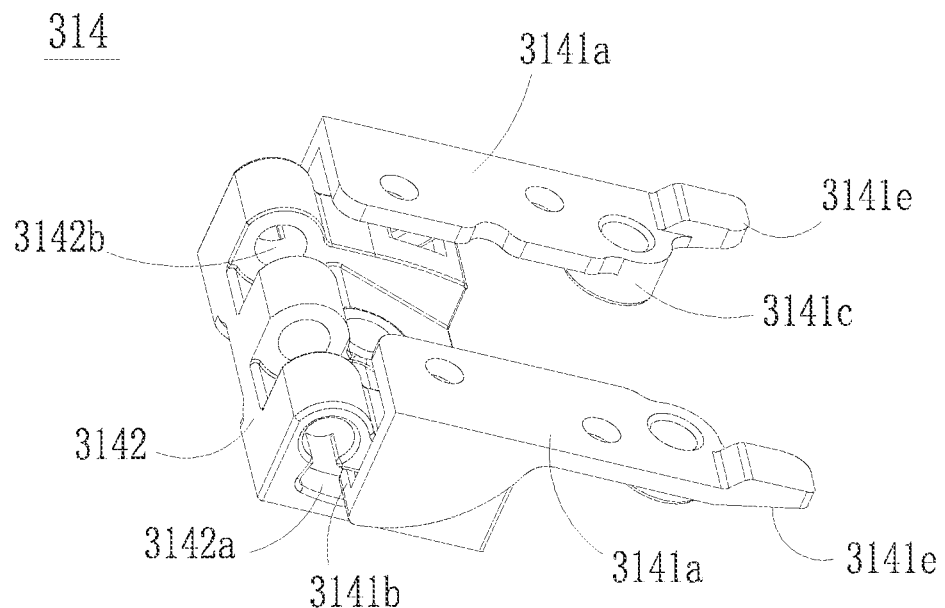
FIG. 24 is a schematic structural diagram of a support structure.

In a specific implementation, as shown in FIG. 24, the support structure 314 includes a mounting part 3141 and an adapter 3142, an end of the swing arm 311 farther away from the fixed structure 312 is rotatably connected to the adapter 3142, and the mounting part 3141 is slidably connected to the adapter 3142 according to a preset track.

The adapter 3142 is fixedly connected to the first housing 1 or the second housing 2 of the electronic device, so that the adapter 3142 can drive the first housing 1 or the second housing 2 to move synchronously. When the swing arm 311 rotates, the mounting part 3141 and the adapter 3142 also move relative to each other, so as to rotatably open or close the first housing 1 and the second housing 2, preventing the first housing 1 and the second housing 2 from being interfered with or jammed by other surrounding components.

The limit structure 3141e may be integrally formed with the mounting part 3141. To be specific, the limit structure 3141e may be formed on an end of the mounting part 3141 closer to the fixed structure 312.

Specifically, the adapter 3142 may be fixedly connected to the first housing 1 or the second housing 2 of the electronic device by using a screw, or certainly, by riveting, welding, or other means, which is not limited in the embodiment.

In addition, to ensure stable connection between the panel 32 and the mounting part 3141, the panel 32 may be riveted to the mounting part 3141.

In a specific implementation, as shown in FIGS. 7 to 9 and FIGS. 25 and 26, the limit part 313 is provided with a positioning groove 3131, the mounting part 3141 is provided with a positioning rod 3141c, and the positioning rod 3141c is fixedly mounted in the positioning groove 3131. The positioning rod 3141c of the mounting part 3141 protrudes from a side facing away from the panel 32. During mounting of the limit part 313, the positioning groove 3131 of the limit part 313 may be fit onto a corresponding positioning rod 3141c to implement pre-positioning for mounting of the limit part 313, and then the limit part 313 and the mounting part 3141 may be locked and fastened by using a screw 316. This not only facilitates operation but also ensures reliable connection between the limit part 313 and the mounting part 3141.

It should be noted that, as shown in FIG. 12, a mounting space 317 is provided on a side of the mounting part 3141 facing away from the panel 32, and the mounting space 317 is formed between the adapter 3142, the mounting part 3141, and the fixed structure 312. The limit part 313 can be provided in the mounting space 317 without occupying additional Z-directional space, thereby ensuring both the flatness of the panel 32 and the thinness and lightness of the electronic device.

Figure 25:
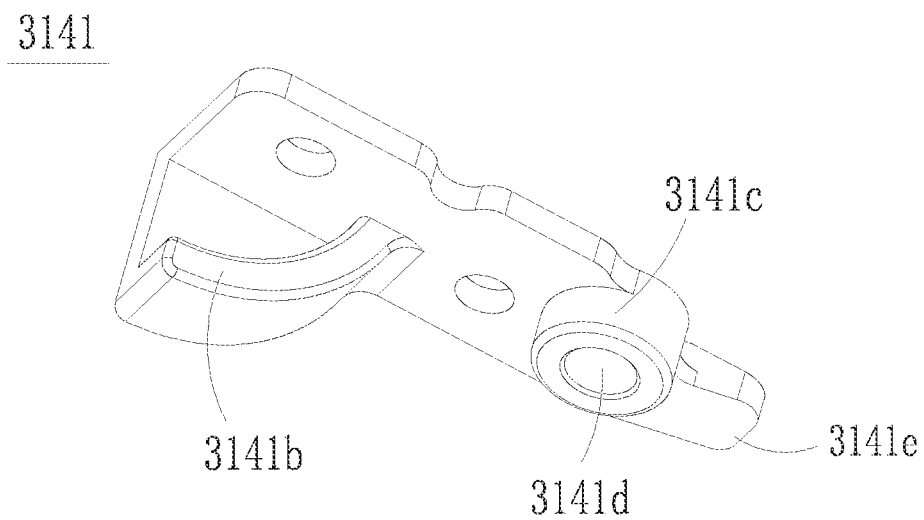
FIG. 25 is a first schematic structural diagram of a mounting part.
Figure 26:
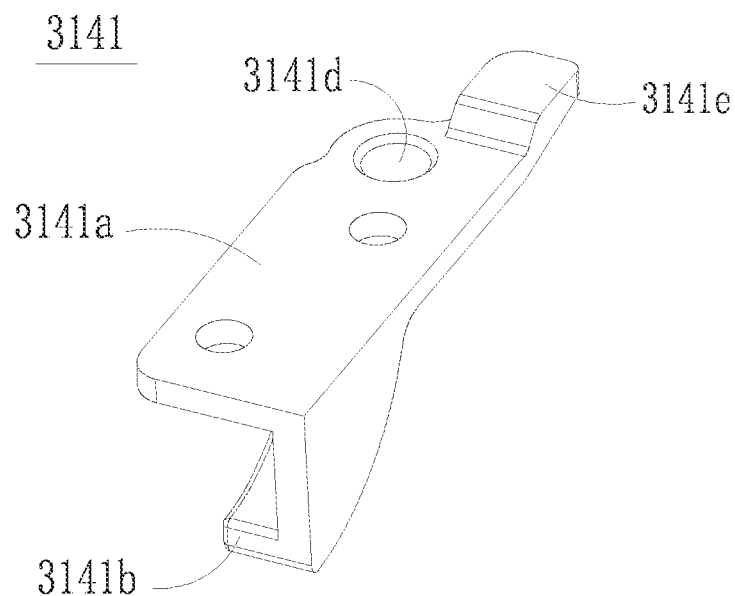
FIG. 26 is a second schematic structural diagram of a mounting part.

Specifically, as shown in FIG. 9, FIG. 25, and FIG. 26, the positioning groove 3131 is provided with a mounting hole 3131a, the positioning rod 3141c is provided with a threaded hole 3141d, and the positioning rod 3141c is fixedly connected to the positioning groove 3131 through cooperation of the mounting hole 3131a, the threaded hole 3141d, and the screw 316. After the positioning rod 3141c of the mounting part 3141 is inserted into the positioning groove 3131 of the limit part 313 to complete pre-mounting, the screw 316 may be tightened in the threaded hole 3141d of the positioning rod 3141c through the mounting hole 3131a of the positioning groove 3131, allowing the limit part 313 and the mounting part 3141 to be locked and fastened. This not only facilitates assembling of the limit part 313 and the mounting part 3141, but also ensures reliable connection and fastening of the limit part 313 and the mounting part 3141.

In a specific implementation, as shown in FIG. 24, the mounting part 3141 is provided in a quantity of at least two, and the at least two mounting parts 3141 are respectively provided on two sides of the swing arm 311. The at least two mounting parts 3141 are all connected to the limit part 313. Surfaces of the at least two mounting parts 3141 facing away from the limit part 313 are formed as mounting planes 3141a, and the mounting planes 3141a of the at least two mounting parts 3141 are all located on a same plane. The at least two mounting parts 3141 together support the panel 32, which enhances reliability of supporting the panel 32. The mounting planes 3141a on each mounting part 3141 for supporting the panel 32 are located on the same plane, so that the mounting planes 3141a of each mounting part 3141 have the same flatness, thereby ensuring the flatness of the panel 32, and further ensuring good light and shadow effect of the screen.

In this embodiment, the mounting part 3141 may be specifically provided in a quantity of two, and the two mounting parts 3141 may be respectively provided on two sides of the swing arm 311, thereby providing balanced support force for the panel 32 through the two mounting parts 3141. In addition, two ends of the limit part 313 may be respectively connected to the two mounting parts 3141. Through restriction of the limit part 313, consistency of positions of the two mounting parts 3141 can be ensured, so that the mounting planes 3141a of the two mounting parts 3141 are located on the same plane, thereby ensuring the flatness of the panel 32.

Figure 27:
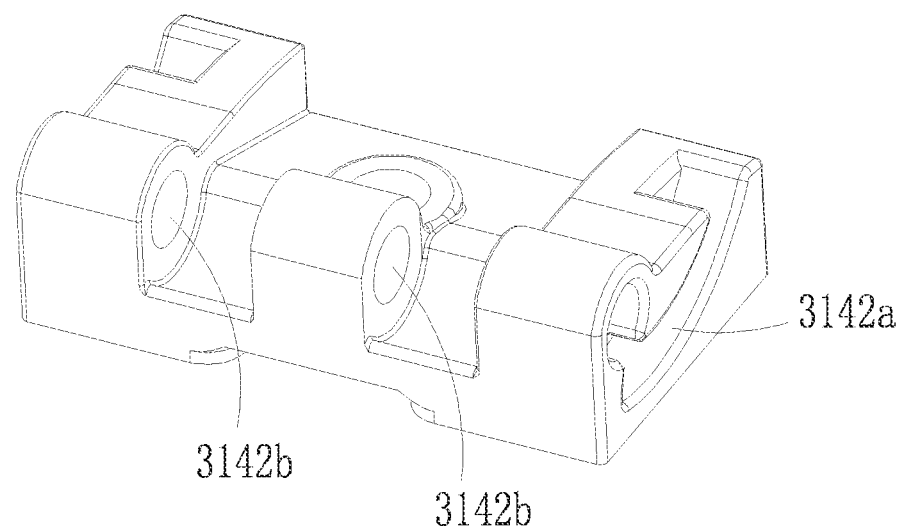
FIG. 27 is a schematic structural diagram of an adapter.

In a specific implementation, as shown in FIG. 25 to FIG. 27, the adapter 3142 is provided with an arc-shaped track groove 3142a, the mounting part 3141 is provided with an arc-shaped guide flange 3141b, and the guide flange 3141b is in a sliding fit with the track groove 3142a.

The track groove 3142a is provided on each of two sides of the adapter 3142 that are perpendicular to a rotation direction of the track groove. Both the track groove 3142a and the guide flange 3141b are arc-shaped, and the guide flange 3141b can slide in the track groove 3142a relative to the track groove 3142a. The cooperation of the guide flange 3141b and the track groove 3142a can ensure that the adapter 3142 rotates stably relative to the swing arm.

It should be noted that, to implement the relative sliding of the guide flange 3141b and the track groove 3142a, a tiny gap is left between the guide flange 3141b and the track groove 3142a. When the mounting part 3141 is not additionally constrained, such a gap may cause the mounting part 3141 to wobble, unable to ensure position consistency of the two mounting parts 3141. As a result, the mounting planes 3141a of the two mounting parts 3141 are not on the same plane, such that the flatness of the panel 32 at the position supported by the rotatable support mechanism 31 is inconsistent with the flatness of other positions, thereby causing the screen to be uneven in the unfolded state and affecting light and shadow effect.

In view of this, in this embodiment, the limit part 313 is connected to both the two mounting parts 3141 to restrict the two mounting parts 3141, which can ensure the position consistency of the two mounting parts 3141. When the screen is in the fully unfolded state, the limit part 313 is able to abut against the swing arm to implement restriction, which prevents the mounting part 3141 from floating up and down when the screen is in the fully unfolded state, thereby ensuring the flatness of the panel 32 and ensuring light and shadow effect of the screen in the unfolded state.

In a specific implementation, as shown in FIG. 7, the rotatable support mechanism 31 further includes a hinge pin 315, the swing arm 311 is provided with a first rotation hole 3111, the adapter 3142 is provided with a second rotation hole 3142b that is coaxially disposed with the first rotation hole 3111, and the swing arm 311 is rotatably connected to the adapter 3142 through cooperation of the first rotation hole 3111, the second rotation hole 3142b, and the hinge pin 315. The hinge pin 315 can ensure that the first rotation hole 3111 and the second rotation hole 3142b coaxially rotate, avoiding a wobble between the swing arm and the adapter 3142. In addition, connection using the hinge pin 315 also facilitates assembly. The hinge pin 315 may be fixedly mounted on the adapter 3142 or the swing arm 311.

Figure 10:
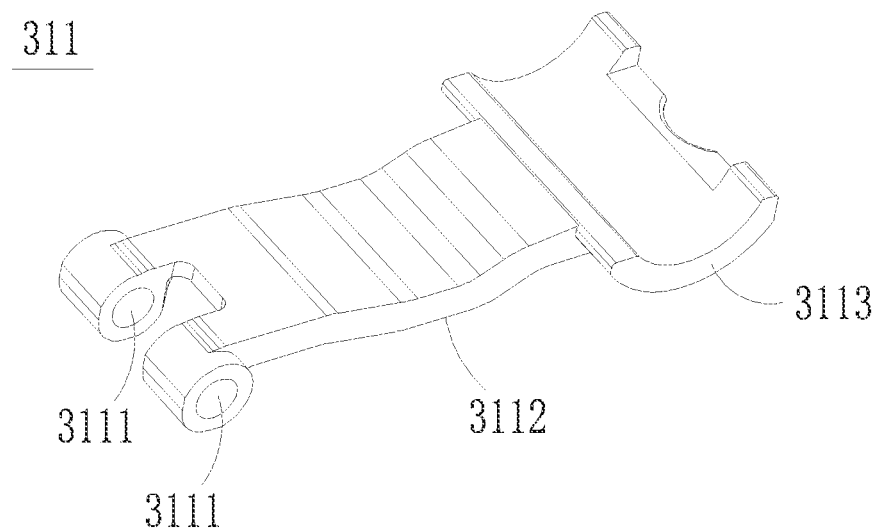
FIG. 10 is a first schematic structural diagram of a swing arm.
Figure 29:
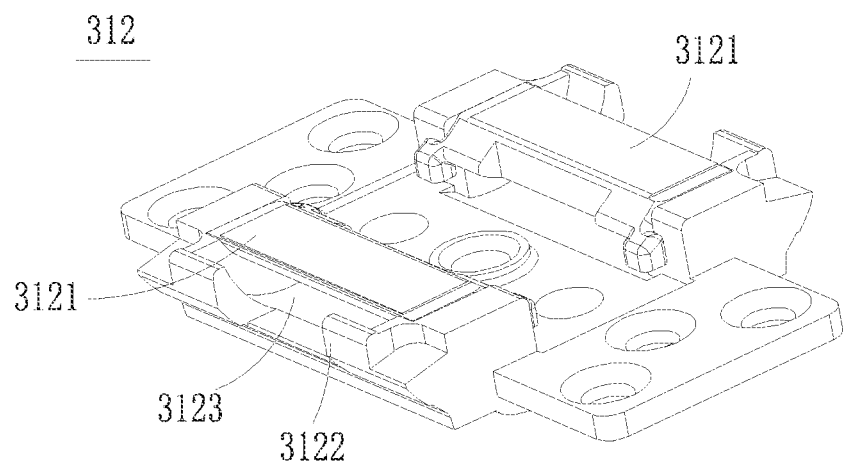
FIG. 29 is a schematic structural diagram of a fixed structure.

In a specific implementation, as shown in FIG. 10, FIG. 11, and FIG. 29, an end of the swing arm 311 is provided with an arc-shaped rotating portion 3113, an arc-shaped rotation space 3123 is formed on the fixed structure 312, and the rotating portion 3113 is rotatably disposed in the rotation space 3123. The arc-shaped rotating portion 3113 is formed as a structure with a side facing towards the panel 32 being recessed and a side facing away from the panel 32 being arched. The rotation space 3123 matches the rotating portion 3113 in shape, and an inner wall of the rotation space 3123 can provide movement guidance for the rotating portion 3113 to implement rotation of the rotating portion 3113. To rotatably open and close the first housing 1 and the second housing 2 of the electronic device, the rotation center of the rotating portion 3113 may be at a position in the external space of the electronic device.

Figure 28:
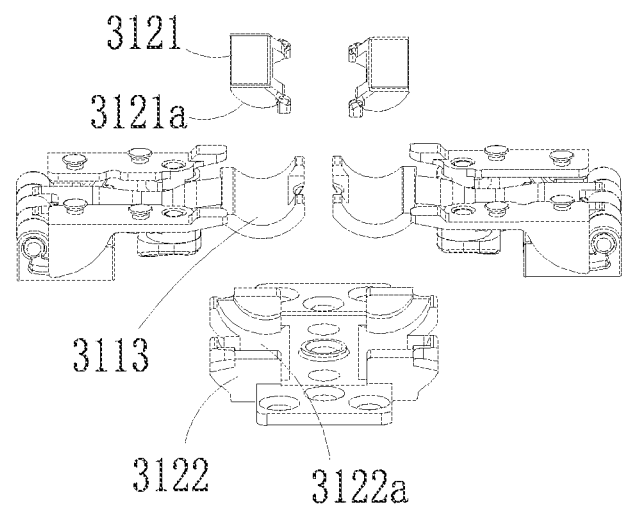
FIG. 28 is a third partial exploded view of a rotatable support mechanism.

Specifically, as shown in FIG. 28 and FIG. 29, the fixed structure 312 includes a first supporting part 3121 and a second supporting part 3122, the first supporting part 3121 is fixedly connected to the second supporting part 3122, and the rotation space 3123 is formed between the first supporting part 3121 and the second supporting part 3122.

The first supporting part 3121 and the second supporting part 3122 are respectively located on two sides of the rotating portion 3113, a side surface of the first supporting part 3121 facing towards the rotating portion 3113 is a first arc-shaped face 3121a, a side surface of the second supporting part 3122 facing towards the rotating portion 3113 is a second arc-shaped face 3122a, and the rotation space 3123 is formed between the first arc-shaped face 3121a and the second arc-shaped face 3122a. The first arc-shaped face 3121a and the second arc-shaped face 3122a can guide the rotation of the rotating portion 3113. In addition, an edge region of the first supporting part 3121 may be welded to an edge region of the second supporting part 3122, and the rotation space 3123 may be formed in a middle region between the first supporting part 3121 and the second supporting part 3122. Certainly, the first supporting part 3121 and the second supporting part 3122 may alternatively be fastened by riveting or other means, which is not limited in the embodiment.

The foregoing descriptions are merely embodiments of this application, but are not intended to limit this application. Persons skilled in the art understand that this application may have various modifications and variations. Any modification, equivalent replacement, or improvement made without departing from the principle of this application shall fall within the protection scope of this application.

What is claimed is:

1. A rotating shaft assembly, comprising:
a panel; and
a rotatable support mechanism coupled to the panel, wherein the rotatable support mechanism comprises:
   a swing arm;
   a fixed structure;
   a limit part; and
   a support structure that is provided with a mounting plane, wherein the panel is fastened on the mounting plane, and wherein an end of the support structure is provided with a limit structure,
wherein two ends of the swing arm are rotatably connected to the fixed structure and the support structure respectively, and a first limit portion is formed on an end of the swing arm facing away from the panel,
wherein the limit part is connected to the support structure, and a second limit portion is formed on an end of the limit part facing towards the panel,
wherein when the rotatable support mechanism is in a fully unfolded state, the first limit portion abuts against the second limit portion, and the limit structure overlaps an end of the fixed structure facing towards the panel, and
wherein when the rotatable support mechanism is in a non-fully folded state, the limit structure is separated from the fixed structure.

2. The rotating shaft assembly of claim 1, wherein the first limit portion is a surface of the end of the swing arm facing away from the panel.

3. The rotating shaft assembly of claim 1, wherein the second limit portion is a surface of the end of the limit part facing towards the panel.

4. The rotating shaft assembly of claim 1, wherein when the rotatable support mechanism is in the non-fully folded state, the first limit portion is separated from the second limit portion.

5. The rotating shaft assembly of claim 1, wherein the limit structure is a thin plate structure, a limit surface is formed on the end of the fixed structure facing towards the panel, and the limit structure abuts against the limit surface when the rotatable support mechanism is in the fully unfolded state.

6. The rotating shaft assembly of claim 1, wherein the support structure comprises:
an adapter, wherein an end of the swing arm farther away from the fixed structure is rotatably connected to the adapter; and
a mounting part that is slidably connected to the adapter according to a preset track.

7. The rotating shaft assembly of claim 6, wherein the limit part is provided with a positioning groove, the mounting part is provided with a positioning rod, and the positioning rod is fixedly mounted in the positioning groove.

8. The rotating shaft assembly of claim 7, wherein the positioning groove is provided with a mounting hole, the positioning rod is provided with a threaded hole, and the positioning rod is fixedly connected to the positioning groove through cooperation of the mounting hole, the threaded hole, and a screw.

9. The rotating shaft assembly of claim 7, wherein a mounting space is provided on a side of the mounting part facing away from the panel, and the mounting space is formed between the adapter, the mounting part, and the fixed structure.

10. The rotating shaft assembly of claim 6, wherein the mounting part is one of at least two mounting parts, and the at least two mounting parts are respectively provided on two sides of the swing arm, and wherein the at least two mounting parts are all connected to the limit part, surfaces of the at least two mounting parts facing away from the limit part are formed as the mounting planes, and the mounting planes of the at least two mounting parts are all located on a same plane.

11. The rotating shaft assembly of claim 6, wherein the adapter is provided with an arc-shaped track groove, the mounting part is provided with an arc-shaped guide flange, and the guide flange is in a sliding fit with the track groove.

12. The rotating shaft assembly of claim 11, wherein the track groove is provided on each of two sides of the adapter that are perpendicular to a rotation direction of the track groove, and both the track groove and the guide flange are arc-shaped.

13. The rotating shaft assembly of claim 6, wherein the rotatable support mechanism further comprises a hinge pin, the swing arm is provided with a first rotation hole, the adapter is provided with a second rotation hole that is coaxially disposed with the first rotation hole, and the swing arm is rotatably connected to the adapter through cooperation of the first rotation hole, the second rotation hole, and the hinge pin.

14. The rotating shaft assembly of claim 1, wherein an end of the swing arm is provided with an arc-shaped rotating portion, an arc-shaped rotation space is formed on the fixed structure, and the rotating portion is rotatably disposed in the rotation space.

15. The rotating shaft assembly of claim 14, wherein the fixed structure comprises a first supporting part fixedly connected to a second supporting part, and wherein the rotation space is formed between the first supporting part and the second supporting part.

16. The rotating shaft assembly of claim 15, wherein the first supporting part and the second supporting part are respectively located on two sides of the rotating portion, a side surface of the first supporting part facing towards the rotating portion is a first arc-shaped face, a side surface of the second supporting part facing towards the rotating portion is a second arc-shaped face, and the rotation space is formed between the first arc-shaped face and the second arc-shaped face.

17. The rotating shaft assembly of claim 1, further comprising a rotating shaft housing, wherein the fixed structure is fixedly mounted to the rotating shaft housing.

18. The rotating shaft assembly of claim 1, wherein the panel is made of a carbon fiber material.

19. The rotating shaft assembly of claim 6, wherein the panel is riveted to the mounting part.

20. An electronic device, comprising:
a first housing;
a second housing;
a screen that covers the first housing and the second housing; and
a rotating shaft assembly, comprising:
a panel that fixedly supports the screen; and
a rotatable support mechanism coupled to the panel, wherein the rotatable support mechanism comprises:
a swing arm;
a fixed structure;
a limit part; and
a support structure that is provided with a mounting plane, wherein the panel is fastened on the mounting plane, and wherein an end of the support structure is provided with a limit structure,
wherein two ends of the swing arm are rotatably connected to the fixed structure and the support structure respectively, and a first limit portion is formed on an end of the swing arm facing away from the panel,
wherein the limit part is connected to the support structure, and a second limit portion is formed on an end of the limit part facing towards the panel,
wherein when the rotatable support mechanism is in a fully unfolded state, the first limit portion abuts against the second limit portion, and the limit structure overlaps an end of the fixed structure facing towards the panel,
wherein when the rotatable support mechanism is in a non-fully folded state, the limit structure is separated from the fixed structure, and
wherein the first housing and the second housing are configured to be opened or closed through the rotating shaft assembly.

* * * * *